(12) United States Patent
Wang et al.

(10) Patent No.: US 10,437,299 B2
(45) Date of Patent: Oct. 8, 2019

(54) HEAT-DISSIPATING STRUCTURE OF ELECTRONIC DEVICE

(71) Applicant: Chiun Mai Communication Systems, Inc., New Taipei (TW)

(72) Inventors: Hsin-Wei Wang, New Taipei (TW); Chia-Hsin Chang, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 15/989,310

(22) Filed: May 25, 2018

(65) Prior Publication Data

US 2019/0004574 A1     Jan. 3, 2019

(30) Foreign Application Priority Data

Jun. 30, 2017    (CN) .......................... 2017 1 0531016

(51) Int. Cl.
    *G06F 1/16*         (2006.01)
    *G06F 1/20*         (2006.01)
    *H04M 1/02*        (2006.01)
    *H05K 7/20*        (2006.01)

(52) U.S. Cl.
    CPC ............ *G06F 1/203* (2013.01); *G06F 1/1626* (2013.01); *G06F 1/1635* (2013.01); *H04M 1/0202* (2013.01); *H05K 7/205* (2013.01); *H05K 7/20481* (2013.01); *H05K 7/20954* (2013.01)

(58) Field of Classification Search
    CPC .................................................. G06F 1/1626
    See application file for complete search history.

(56) References Cited

U.S. PATENT DOCUMENTS

| | | | | |
|---|---|---|---|---|
| 6,567,269 | B2* | 5/2003 | Homer | G06F 1/203 165/80.4 |
| 8,391,010 | B2* | 3/2013 | Rothkopf | G06F 1/1626 313/46 |
| 9,244,504 | B2* | 1/2016 | Hsieh | G06F 1/20 |
| 9,247,034 | B2* | 1/2016 | Hsieh | G06F 1/20 |
| 9,568,255 | B2* | 2/2017 | Tan | F28D 15/0275 |
| 9,864,419 | B2* | 1/2018 | Rhee | G06F 1/203 |
| 10,114,430 | B2* | 10/2018 | Shen | G06F 1/203 |
| 2014/0321058 | A1* | 10/2014 | Fujieda | G06F 1/203 361/700 |

(Continued)

FOREIGN PATENT DOCUMENTS

| | | |
|---|---|---|
| TW | I264272 | 10/2006 |
| TW | 201017085 | 5/2010 |

(Continued)

*Primary Examiner* — Anthony Q Edwards
(74) *Attorney, Agent, or Firm* — ScienBiziP, P.C.

(57) ABSTRACT

An electronic device includes a first housing portion, a second housing portion, a circuit board, a battery, a display screen, and a heat-dissipating structure. The second housing portion is coupled together with the first housing portion. The circuit board and the battery are received within the second housing portion. The heat-dissipating structure is arranged between the circuit board and the display screen. The heat-dissipating structure includes a substrate including a first surface and a second surface opposite to the first surface and defines an opening passing through the first surface and the second surface. The heat dissipating element is located in the opening.

15 Claims, 6 Drawing Sheets

(56) References Cited

U.S. PATENT DOCUMENTS

2016/0007504 A1* 1/2016 Wu .................. G06F 1/203
  361/700
2016/0088769 A1* 3/2016 Hsiao .................. G06F 1/20
  361/700

FOREIGN PATENT DOCUMENTS

| TW | 201531193 A | 8/2015 |
| TW | I514122 | 12/2015 |
| TW | M522552 | 5/2016 |
| TW | I573521 | 3/2017 |

* cited by examiner

HEAT-DISSIPATING STRUCTURE OF ELECTRONIC DEVICE

FIELD

The subject matter herein generally relates to electronic devices, and more preferably to a heat-dissipating structure of an electronic device.

BACKGROUND

Generally, as electronic devices are made smaller, the electronic devices more easily overheat.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
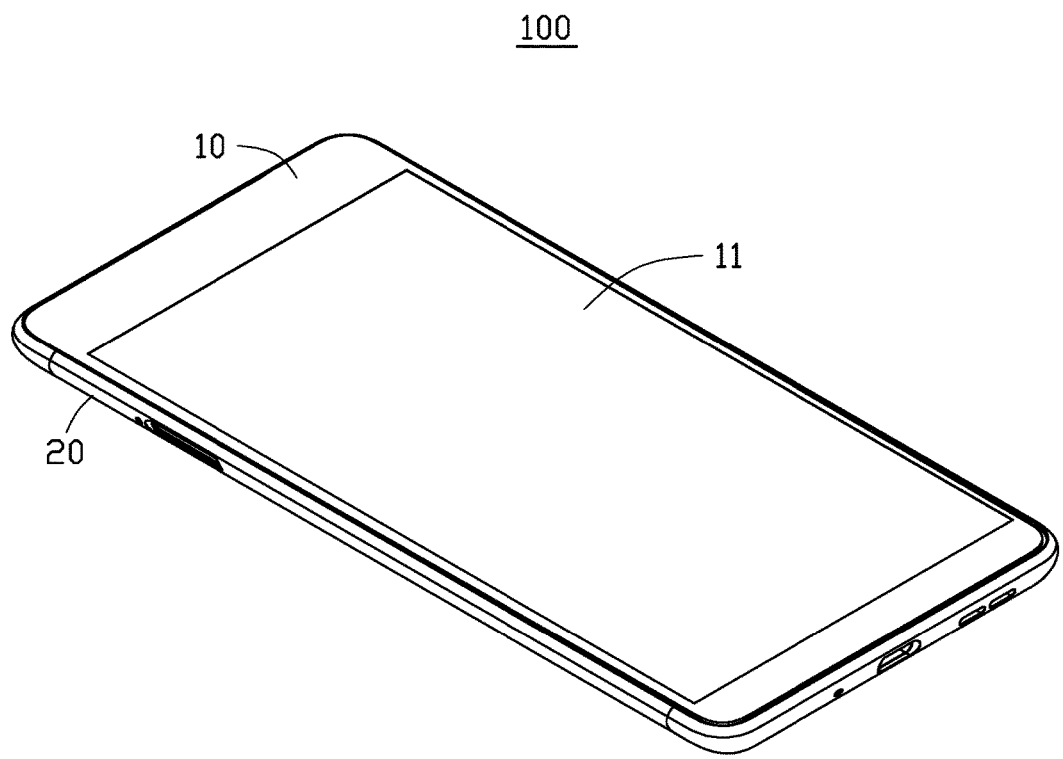
FIG. 1 is an assembled, isometric view of an exemplary embodiment of an electronic device in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
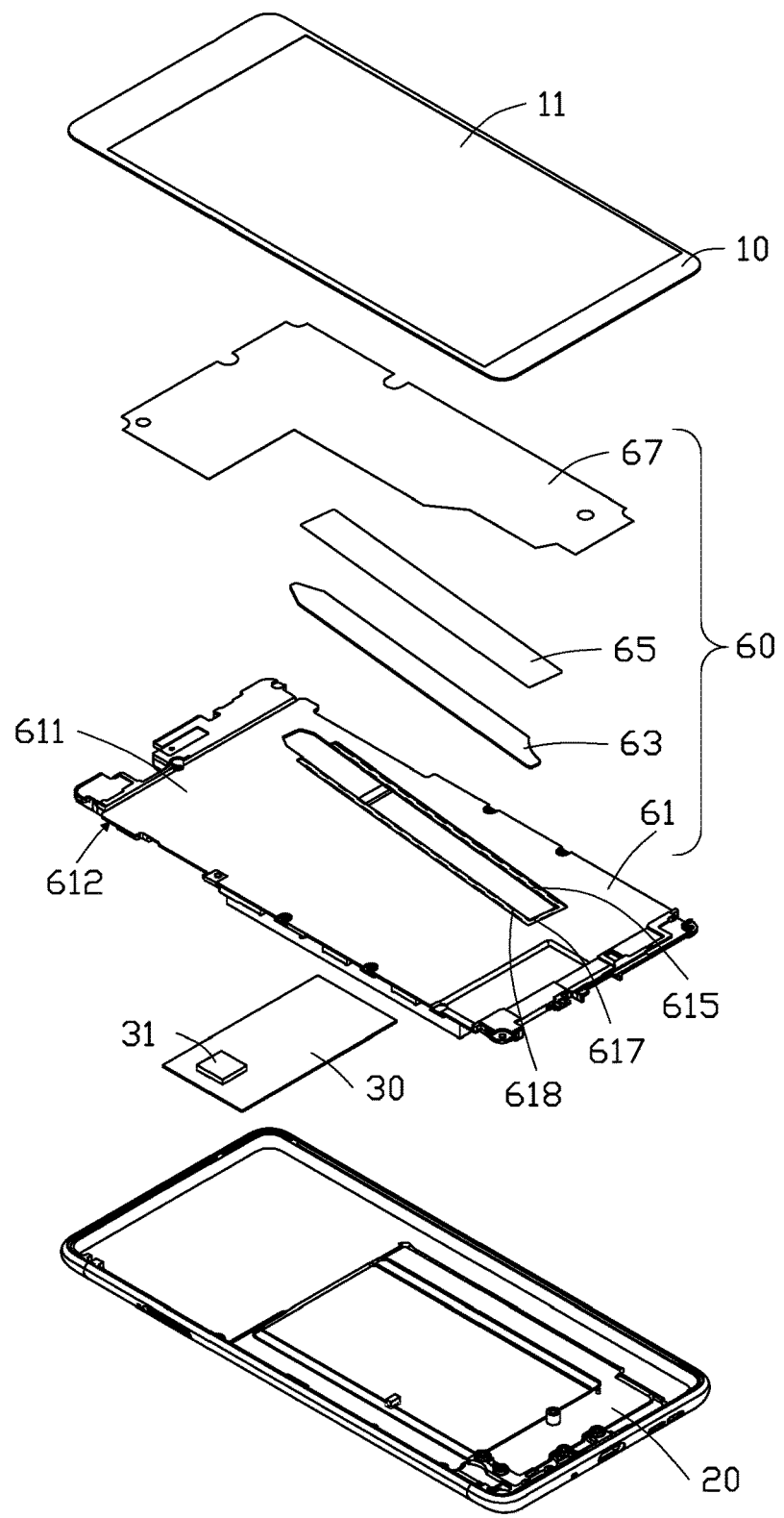
FIG. 2 is an exploded, isometric view of the electronic device of FIG. 1 having a heat-dissipating structure.
Figure 3:
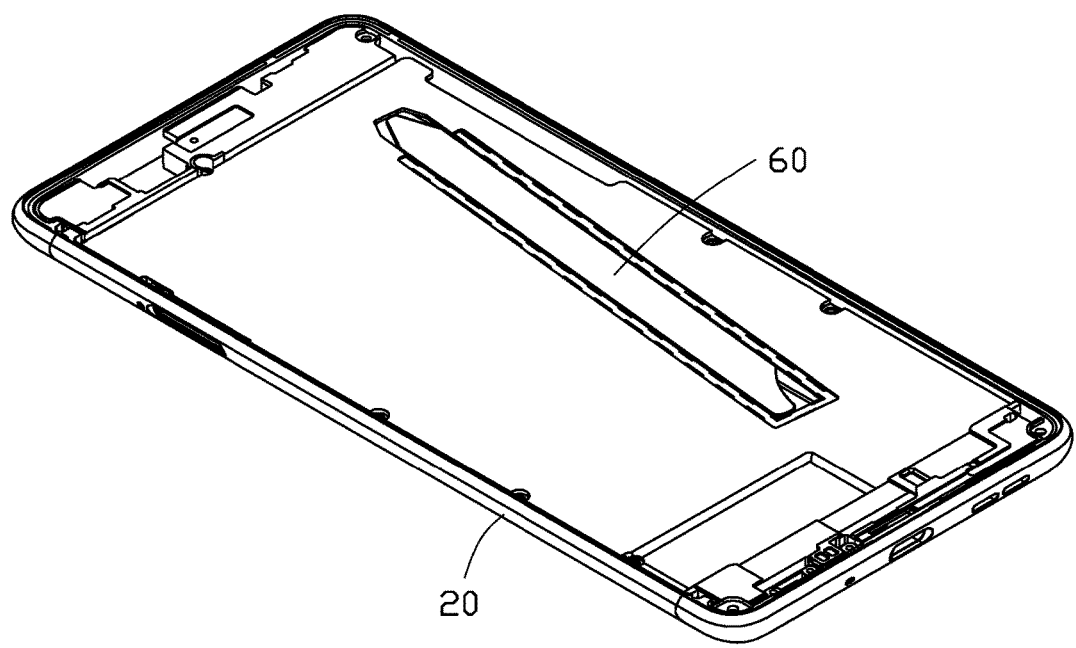
FIG. 3 is an isometric view of the heat-dissipating structure assembled with the second housing portion of FIG. 1.

FIGS. 1-3 illustrate an embodiment of an electronic device 100 including a first housing portion 10, a second housing portion 20, a circuit board 30, a battery 40 (shown in FIG. 5) and a heat-dissipating structure 60. The second housing portion 20 is coupled together with the first housing portion 10. The circuit board 30, the battery 40, and the heat-dissipating structure 60 are accommodated within the second housing portion 20. The electronic device 100 may be a mobile phone, a tablet computer, or the like.

The first housing portion 10 is a front cover of the electronic device 100, and a display screen 11 is associated with the first housing portion 10. The second housing portion 20 is a back cover of the electronic device 100 and assembled with the first housing portion 10 (shown in FIG. 1). The second housing portion 20 defines an accommodating space (not labeled). The circuit board 30, the battery 40, and the heat-dissipating structure 60 are accommodated within the accommodating space. The circuit board 30 includes a central processing unit (CPU) 31 and other electronic components.

The heat-dissipating structure 60 includes a substrate 61 and a heat dissipating element 63 located in the substrate 61. In at least one embodiment, the substrate 61 is made of metal, and at least one portion of the heat dissipating element 63 is in direct or indirect contact with the substrate 61.

The substrate 61 may be a middle frame of the electronic device 100 and includes a first surface 611 and a second surface 612. The first surface 611 and the second surface 612 are on opposite sides of the substrate 61. The substrate 61 defines an opening 615 passing through the first surface 611 and the second surface 612. The heat dissipating element 63 is located in the opening 615.

Figure 6:
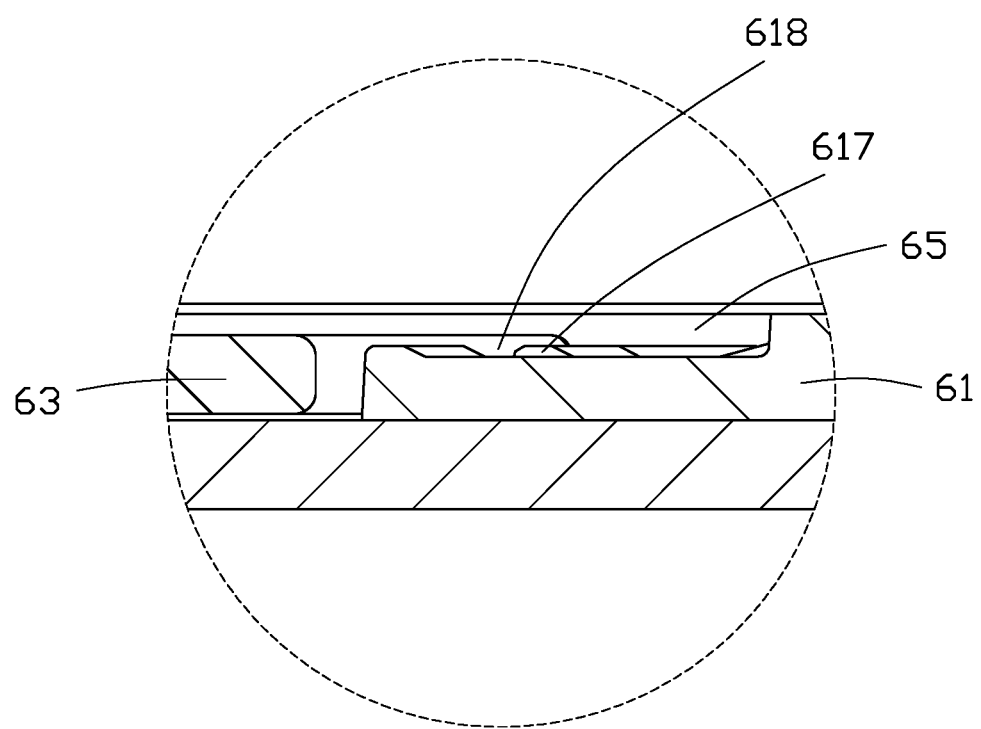
FIG. 6 is an enlarged view of circled portion VI of FIG. 4.

In at least one embodiment, the heat-dissipating structure 60 further includes a fixing member 65, which is a metal plate. The heat dissipating element 63 is fixed to the fixing member 65 and installed on the substrate 61 through the fixing member 65. In at least one embodiment, the heat dissipating element 63 may be soldered to the fixing member 65. In another embodiment, the heat dissipating element 63 may be fixed to the fixing member 65 by glue. In at least one embodiment, the substrate 61 includes two ledges 617 (only one shown in FIG. 6) protruding respectively from two sides of the opening 615. The fixing member 65 is coupled to the ledge 617. One side of the ledge 617 may define a groove 618 (shown in FIG. 6). In at least one embodiment, the fixing member 65 is fixed to the ledge 617 by glue. Excessive glue may flow into the groove 618 during a glue dispensing process. The surface of the fixing member 65 opposite to the heat dissipating element 63 is aligned with the first surface 611 of the substrate 61, and the surface of the heat dissipating element 63 opposite to the fixing member 65 is aligned with the second surface 612 of the substrate 61. In this way, a structural strength of the substrate 61 will not be influenced by the heat-dissipating structure 60 located therein, and a thickness of the electronic device 100 does not need to be increased. Thus, the heat dissipating element 63 may dissipate heat without taking up much space.

In another embodiment, the surface of the fixing member 65 opposite to the heat dissipating element 63 is aligned with the first surface 611 of the substrate 61, and the surface of the heat dissipating element 63 opposite to the fixing member 65 protrudes from the second surface 612 of the substrate 61, so that the heat dissipating element 63 can directly contact the battery 40, thereby achieving a heat-dissipating effect.

The heat-dissipating structure 60 further includes a graphite layer 67, disposed on the first surface 611 of the substrate 61 and located below the display screen 11, for dissipating heat generated by the display screen 11.

Figure 4:
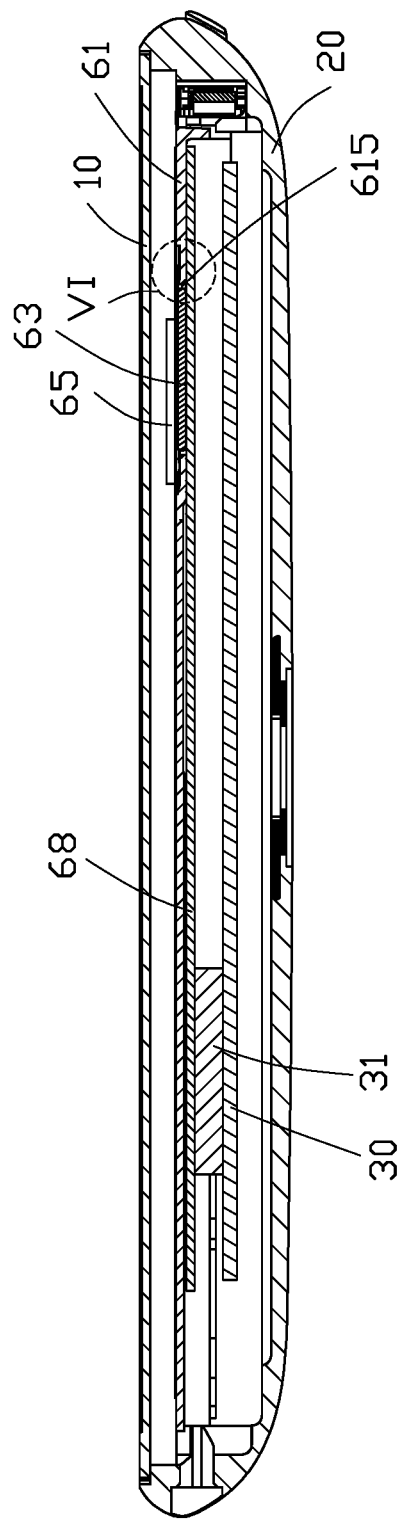
FIG. 4 is a cross-sectional view of the electronic device.

Referring to FIG. 4, in at least one embodiment, the heat dissipating element 63 of the heat-dissipating structure 60 is coupled to the CPU 31. In detail, the heat dissipating element 63 directly or indirectly contacts the CPU 31 of the circuit board 30. In addition, a metal layer 68 is arranged between the substrate 61 and the CPU 31. One side of the metal layer 68 contacts the CPU 31, and another side of the metal layer 68 contacts the heat dissipating element 63. The metal layer 68 in contact with the CPU 31 dissipates heat of the CPU 31 to the heat dissipating element 63, thereby achieving a heat-dissipating effect.

Figure 5:
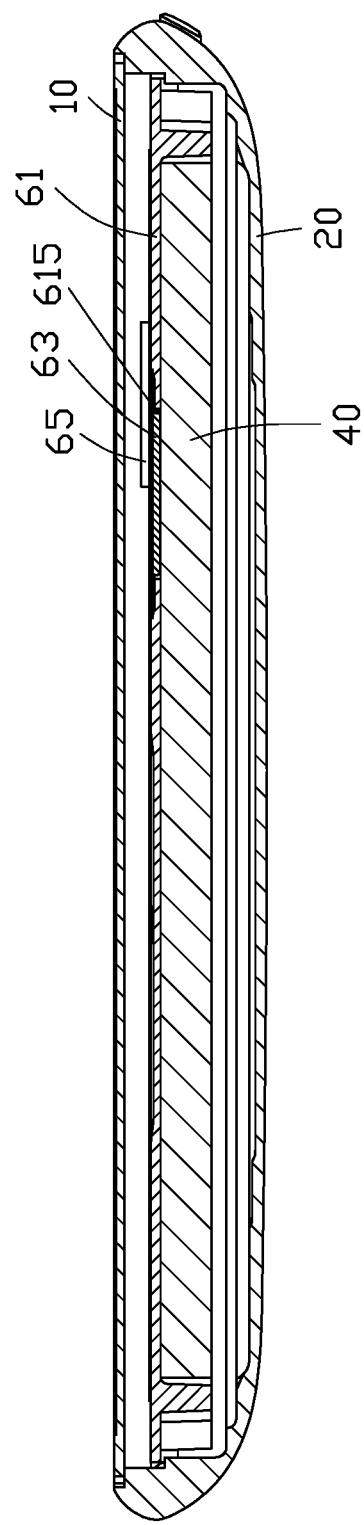
FIG. 5 is another cross-sectional view of the electronic device.

Referring to FIG. 5, in at least one embodiment, an end of the heat dissipating element 63 of the heat-dissipating structure 60 is arranged on the battery 40 to directly contact the battery 40. Because the battery 40 is generally cooler than the heat dissipating element 63, when the heat dissipating element 63 contacts the battery 40, heat from the heat dissipating element 63 is dissipated to the battery 40, thereby achieving a heat-dissipating effect.

In at least one embodiment, a direction of extension of the opening 615 is in a direction from high heat to low heat of the circuit board 30. Thus, the heat dissipating element 63 dissipates heat along this direction.

Based on the heat-dissipating structure 60 described above, there is no need to increase the thickness of the electronic device 100, and a larger heat dissipating element 63 can be disposed in the opening 615 to dissipate heat. Thus, the heat-dissipating structure 60 does not take up much space of the electronic device 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A heat-dissipating structure comprising:
a substrate comprising a first surface and a second surface opposite to the first surface and defining an opening passing through the first surface and the second surface;
a heat dissipating element located in the opening; and
a fixing member, wherein the heat dissipating element is fixed to the fixing member for being installed on the substrate;
wherein a surface of the fixing member opposite to the heat dissipating element is aligned with the first surface of the substrate, and a surface of the heat dissipating element opposite to the fixing member is aligned with the second surface of the substrate.

2. The heat-dissipating structure of claim 1, wherein the substrate comprises two ledges protruding respectively from two sides of the opening, and the fixing member is coupled to the ledges.

3. The heat-dissipating structure of claim 2, wherein a groove is defined in the ledge.

4. The heat-dissipating structure of claim 1, further comprising a graphite layer disposed on the first surface of the substrate.

5. The heat-dissipating structure of claim 1, wherein the substrate is made of metal, and at least one portion of the heat dissipating element is in direct or indirect contact with the substrate.

6. An electronic device comprising:
a first housing portion;
a second housing portion coupled together with the first housing portion;
a display screen arranged on the first housing portion;
a circuit board and a battery received within the second housing portion; and
a heat-dissipating structure arranged between the circuit board and the display screen, wherein the heat-dissipating structure comprises:
a substrate comprising a first surface and aa second surface opposite to the first surface and defining an opening passing through the first surface and the second surface;
a heat dissipating element located in the opening; and
a fixing member, wherein the heat dissipating element is fixed to the fixing member for being installed on the substrate;
wherein a surface of the fixing member opposite to the heat dissipating element is aligned with the first surface of the substrate, and a surface of the heat dissipating element opposite to the fixing member is aligned with the second surface of the substrate.

7. The electronic device of claim 6, wherein the substrate comprises two ledges protruding respectively from two sides of the opening, and the fixing member is coupled to the ledges.

8. The electronic device of claim 7, wherein a groove is defined in the ledge.

9. The electronic device of claim 6, wherein the heat-dissipating structure further comprises a graphite layer disposed on the first surface of the substrate.

10. The electronic device of claim 6, wherein the substrate is made of metal, and at least one portion of the heat dissipating element is in direct or indirect contact with the substrate.

11. The electronic device of claim 6, wherein the heat dissipating element directly contacts the battery.

12. The electronic device of claim 6, wherein a direction of extension of the opening is in a direction from high heat to low heat of the circuit board.

13. The electronic device of claim 6, wherein the circuit board comprises a central processing unit coupled to the heat dissipating element.

14. The electronic device of claim 13, wherein a metal layer is arranged between the central processing unit and the substrate, one side of the metal layer contacts the central processing unit, and another side of the metal layer contacts the heat dissipating element.

15. The electronic device of claim 13, wherein the heat dissipating element contacts the central processing unit.

* * * * *